(12) United States Patent
Hayashi et al.

(10) Patent No.: US 10,777,542 B2
(45) Date of Patent: Sep. 15, 2020

(54) POWER SEMICONDUCTOR MODULE FOR AN INVERTER CIRCUIT AND METHOD OF MANUFACTURING THE SAME

(71) Applicant: ROHM CO., LTD., Kyoto-shi, Kyoto (JP)

(72) Inventors: Kenji Hayashi, Kyoto (JP); Akihiro Suzaki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 24 days.

(21) Appl. No.: 15/997,321

(22) Filed: Jun. 4, 2018

(65) Prior Publication Data

US 2018/0286845 A1   Oct. 4, 2018

Related U.S. Application Data

(63) Continuation of application No. 15/122,590, filed as application No. PCT/JP2015/056375 on Mar. 4, 2015, now Pat. No. 10,014,284.

(30) Foreign Application Priority Data

Mar. 4, 2014   (JP) .................. 2014-041862

(51) Int. Cl.
*H01L 25/18*   (2006.01)
*H01L 23/31*   (2006.01)
(Continued)

(52) U.S. Cl.
CPC .......... *H01L 25/18* (2013.01); *H01L 23/3121* (2013.01); *H01L 23/36* (2013.01);
(Continued)

(58) Field of Classification Search
CPC ..... H01L 25/18; H01L 23/36; H01L 29/7393; H01L 23/3121; H01L 25/07;
(Continued)

(56) References Cited

U.S. PATENT DOCUMENTS 5,701,034 A    12/1997  Marrs
2002/0050640 A1   5/2002  Nakashima et al.
(Continued)

FOREIGN PATENT DOCUMENTS

JP    S5457960 A    5/1979
JP    S635537       1/1988
(Continued)

OTHER PUBLICATIONS

Office Action issued for Japanese Patent Application No. 2019-013436, dated Oct. 31, 2019, 6 pages including English translation.
(Continued)

*Primary Examiner* — Stephen W Smoot
*Assistant Examiner* — Vicki B. Booker
(74) *Attorney, Agent, or Firm* — Hamre, Schumann, Mueller & Larson, P.C.

(57) ABSTRACT

A semiconductor device according to the present invention incudes a semiconductor chip, a conductive member for supporting the semiconductor chip, a joint material provided between the conductive member and the semiconductor chip, and a release groove formed on the surface of the conductive member and arranged away from the semiconductor chip with the one end and the other end of the release groove connected to the peripheral edges of the conductive member, respectively.

18 Claims, 13 Drawing Sheets

(51) Int. Cl.
*H01L 23/00* (2006.01)
*H01L 23/495* (2006.01)
*H01L 25/07* (2006.01)
*H01L 23/36* (2006.01)
*H01L 29/739* (2006.01)
*H01L 23/433* (2006.01)

(52) U.S. Cl.
CPC .. *H01L 23/49562* (2013.01); *H01L 23/49575* (2013.01); *H01L 24/75* (2013.01); *H01L 24/83* (2013.01); *H01L 25/07* (2013.01); *H01L 29/7393* (2013.01); *H01L 23/3107* (2013.01); *H01L 23/4334* (2013.01); *H01L 2224/04026* (2013.01); *H01L 2224/04042* (2013.01); *H01L 2224/0603* (2013.01); *H01L 2224/06181* (2013.01); *H01L 2224/26175* (2013.01); *H01L 2224/27013* (2013.01); *H01L 2224/291* (2013.01); *H01L 2224/32245* (2013.01); *H01L 2224/33* (2013.01); *H01L 2224/33181* (2013.01); *H01L 2224/48247* (2013.01); *H01L 2224/49175* (2013.01); *H01L 2224/73215* (2013.01); *H01L 2224/73265* (2013.01); *H01L 2224/83192* (2013.01); *H01L 2224/83385* (2013.01); *H01L 2224/92247* (2013.01); *H01L 2924/1203* (2013.01); *H01L 2924/13055* (2013.01); *H01L 2924/181* (2013.01); *H01L 2924/3512* (2013.01)

(58) Field of Classification Search
CPC ....... H01L 2224/27013; H01L 23/3107; H01L 2224/33; H01L 2924/3512; H01L 2924/181; H01L 2224/0603; H01L 2224/49175; H01L 23/49562; H01L 23/49575; H01L 23/4334; H01L 2224/04026; H01L 2224/04042; H01L 2224/06181; H01L 2224/291; H01L 2224/32245; H01L 2224/33181; H01L 2224/48247; H01L 2224/73215; H01L 2224/73265; H01L 2224/83192; H01L 2224/83385; H01L 2224/92247; H01L 2924/1203; H01L 2924/13055; H01L 24/75; H01L 24/83; H01L 2224/26175; H01L 2224/83097; H01L 2224/753; H01L 2224/7555; H01L 2224/29036; H01L 2224/32014; H01L 2224/32013; H01L 24/32; H01L 2224/83201
See application file for complete search history.

(56) References Cited

U.S. PATENT DOCUMENTS

| | | |
|---|---|---|
| 2005/0161785 A1 | 7/2005 | Kawashima et al. |
| 2007/0057373 A1 | 3/2007 | Okumura et al. |
| 2012/0306087 A1 | 12/2012 | Bayerer et al. |
| 2013/0155745 A1* | 6/2013 | Tanaka ................. H02M 7/003 363/131 |
| 2014/0027891 A1* | 1/2014 | Kimura ............... H01L 23/3107 257/675 |
| 2015/0123148 A1 | 5/2015 | Nakano et al. |

FOREIGN PATENT DOCUMENTS

| | | |
|---|---|---|
| JP | S63110045 U | 7/1988 |
| JP | H01309336 A | 12/1989 |
| JP | H05235228 A | 9/1993 |
| JP | H0637122 A | 2/1994 |
| JP | H11251510 A | 9/1999 |
| JP | 2000252403 A | 9/2000 |
| JP | 2003124438 A | 4/2003 |
| JP | 2004186622 | 7/2004 |
| JP | 2005217072 A | 8/2005 |
| JP | 2008166626 A | 7/2008 |
| JP | 2008311366 A | 12/2008 |
| JP | 2009170702 A | 7/2009 |
| JP | 2010098153 A | 4/2010 |
| JP | 2010109253 | 5/2010 |
| JP | 2011155286 A | 8/2011 |
| JP | 2011216772 A | 10/2011 |
| JP | 2012015453 A | 1/2012 |
| JP | 2012039683 A | 2/2012 |
| JP | 2012212897 A | 11/2012 |
| JP | 2013123016 A | 6/2013 |
| JP | 2013175551 A | 9/2013 |
| JP | 2014079724 A | 5/2014 |
| WO | 2013118275 A1 | 8/2013 |
| WO | 2013168796 A1 | 11/2013 |

OTHER PUBLICATIONS

Office Action issued for Japanese Patent Application No. 2017-199867, dated Nov. 8, 2018, 16 pages including English translation.
Office Action issued for Japanese Patent Application No. 2017-199867, dated Jun. 21, 2018, 9 pages including English translation.
Office Action issued for European Patent Application No. 15759174.4, dated Sep. 17, 2018, 26 pages.
International Search Report issued for International Patent Application No. PCT/JP2015/056375, dated May 26, 2015, 5 pages including English translation.
International Preliminary Report on Patentability issued for International Patent Application No. PCT/JP2015/056375, dated Sep. 15, 2016, 13 pages including English translation.
Decision to Grant a Patent issued for corresponding Japanese Patent Application No. 2014-041862, dated Sep. 14, 2017, 6 pages including English translation.
Partial Supplementary European Search Report issued for corresponding European Patent Application No. 15759174.4. dated Oct. 2, 2017, 11 pages.

* cited by examiner

※Solder size fixed : chip area / solder area = 1.5

※Solder size fixed : chip area / solder area = 1.5

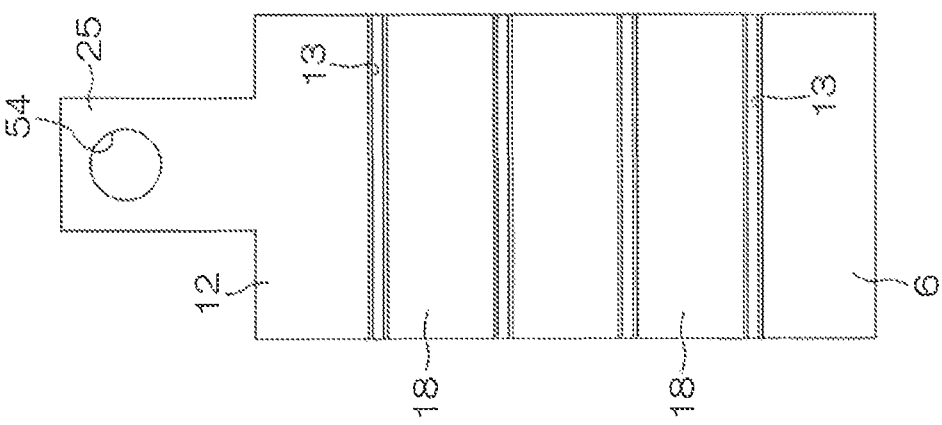
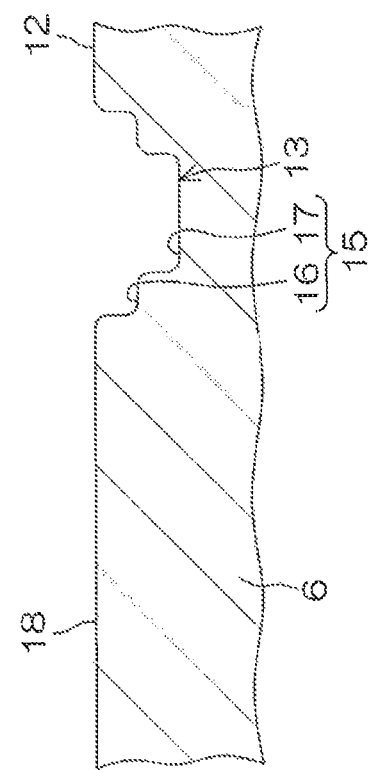

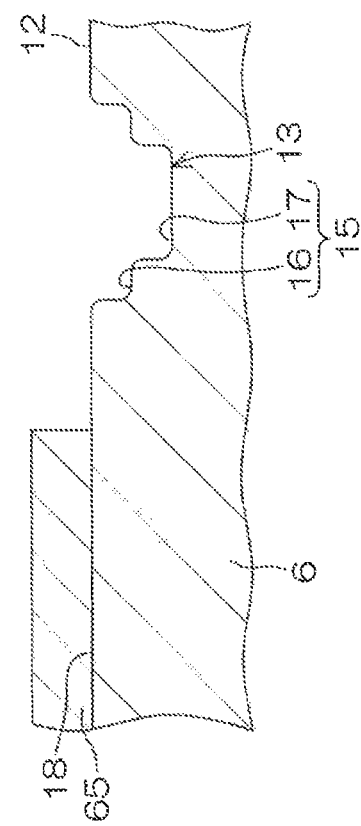
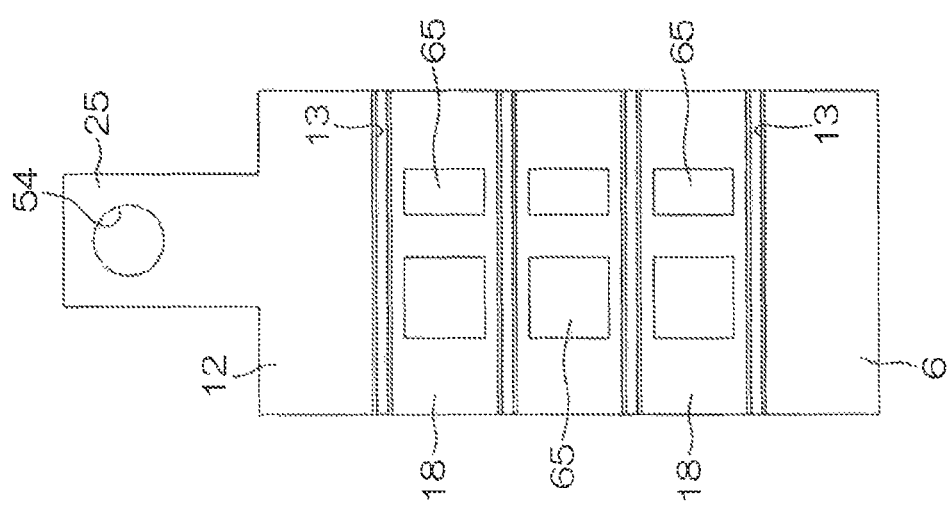

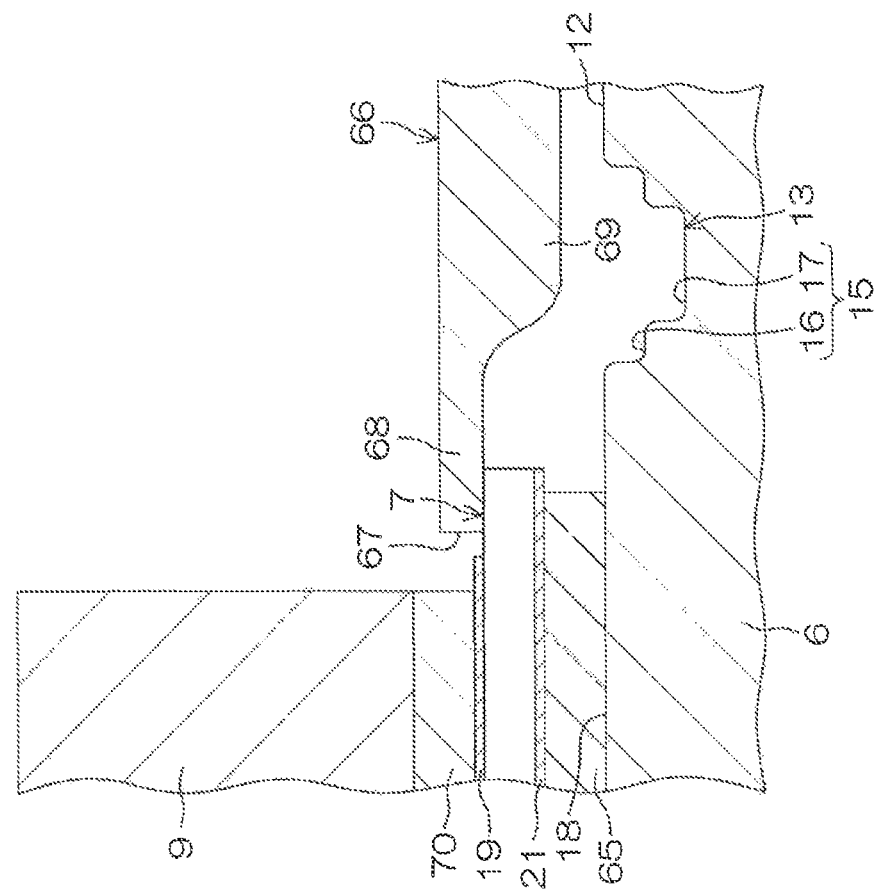
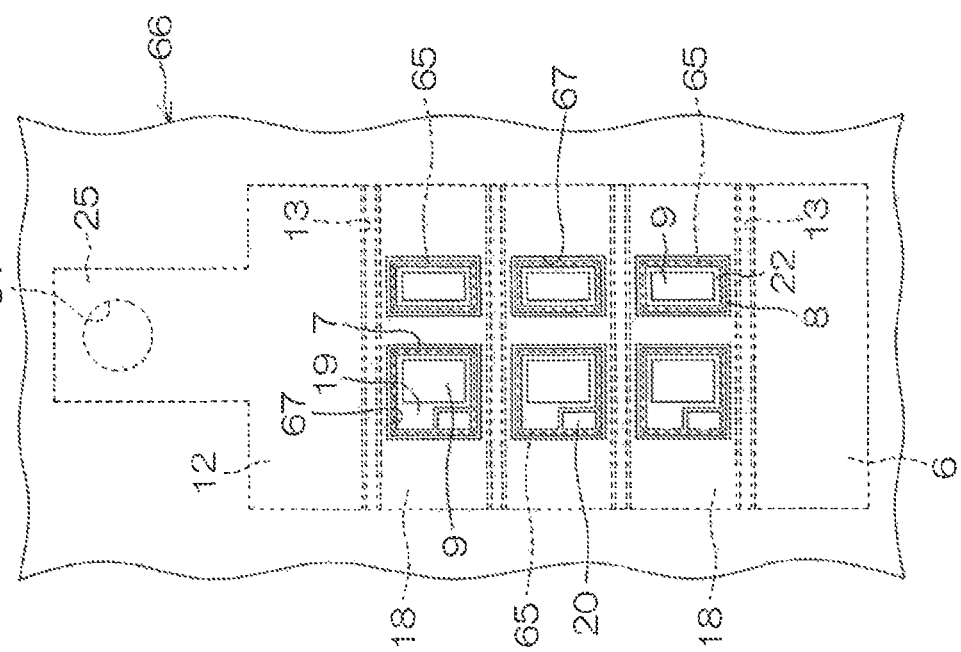
FIG. 13A
FIG. 13B

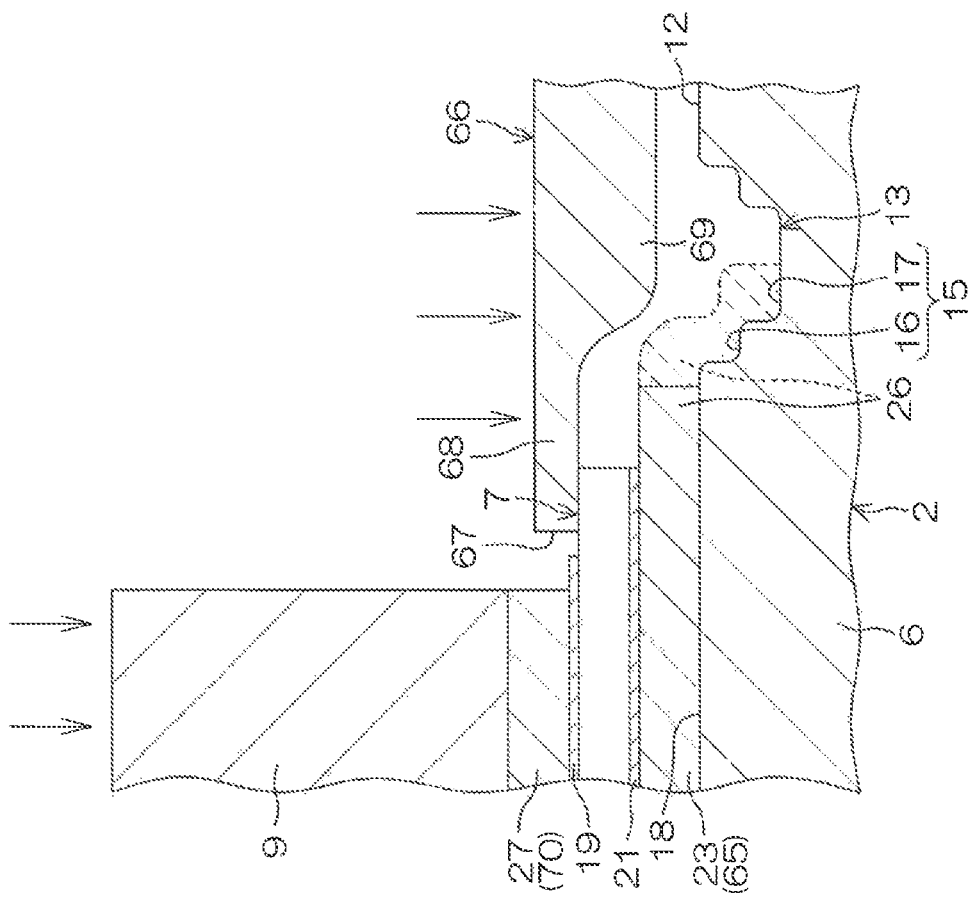
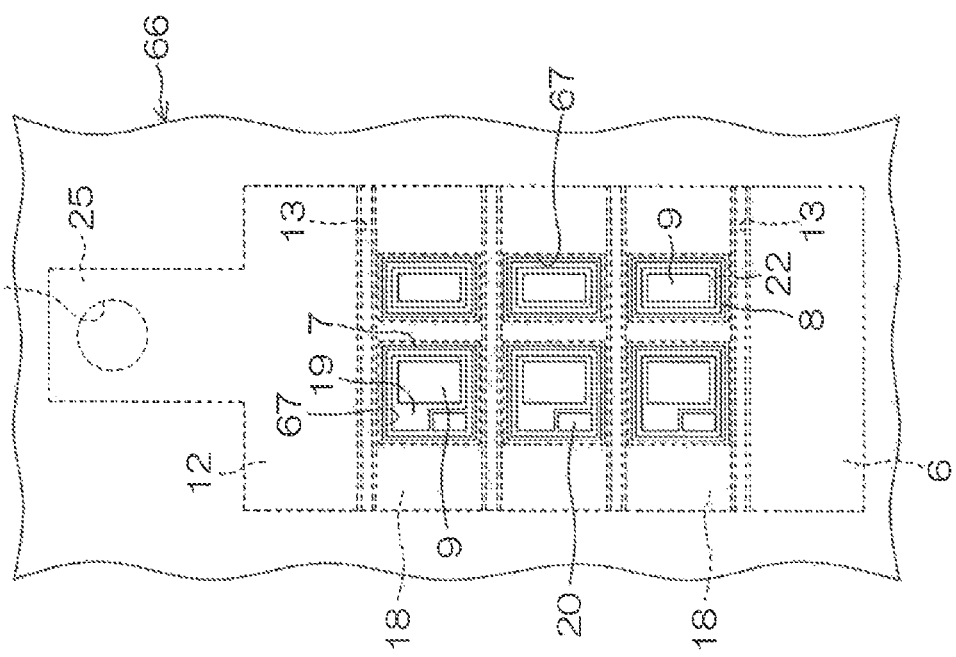
FIG. 14A
FIG. 14B

POWER SEMICONDUCTOR MODULE FOR AN INVERTER CIRCUIT AND METHOD OF MANUFACTURING THE SAME

TECHNICAL FIELD

The present invention relates to a semiconductor device, and more particularly to a power semiconductor module widely adopted for an inverter circuit and so forth and a method of manufacturing the power semiconductor module.

BACKGROUND ART

For example, patent literatures 1 and 2 each disclose a semiconductor device equipped with an island such as a die pad and a semiconductor chip disposed on the island. The semiconductor chip is bonded onto the island using a molten solder.

PRIOR ART DOCUMENT

Patent Literature

Patent literature 1: Japanese Unexamined Patent Application Publication 2011-155286

Patent literature 2: Japanese Unexamined Patent Application Publication H6-37122

SUMMARY OF THE INVENTION

Problem to be Solved by the Invention

Conventionally, a semiconductor chip was bonded onto an island by pressing and crushing a plate-shaped molten solder or a solder paste with a semiconductor chip, causing the solder to be widely dispersed in a space formed between the semiconductor chip and the island. However, such conventional bondings often create problems such as solder leakage and solder shrinkage.

Solder leakage is a phenomenon in which a molten solder leaks outside a semiconductor chip. A leaked solder easily gets on the surface of a semiconductor chip to thus shorten a distance between the end of a rear surface contact to a semiconductor chip and the surface of the semiconductor chip, thereby rendering a withstand voltage of the semiconductor chip lower than an original withstand voltage that depends on the thickness of a chip.

Meanwhile, solder shrinkage is a phenomenon in which a space (void) having no solder therein is created between a semiconductor chip and an island. The void is finally filled with a resin with relatively low thermal conductivity, otherwise remains as a vacant region, and thus the heat dissipation capability of the semiconductor chip can be decreased. Further, a portion of the semiconductor chip cannot be supported by a solder to thereby form a structure in which the portion extends outside the solder, so that stress concentration easily takes place at the base of the structure. Consequently, cracks are liable to form during the process of a thermal cycle in which a rise and fall in temperature is repeated.

Accordingly, there is a need for eliminating both the solder leakage and solder shrinkage at low cost.

The object of the present invention is to provide, at low cost, a semiconductor device and a method of manufacturing the semiconductor device capable of preventing solder shrinkage and minimizing a decrease in withstand voltage even when solder leakage takes place.

Measures for Solving the Problem

An embodiment according to the present invention provides a semiconductor device including a semiconductor chip, a conductive member for supporting the semiconductor chip, a joint material provided between the conductive member and the semiconductor chip, and a release groove formed on the surface of the conductive member and arranged away from the semiconductor chip with the one end and the other end thereof connected to the peripheral edges of the conductive member, respectively.

The semiconductor device can be manufactured by an embodiment of the manufacturing method according to the present invention, which includes a step of preparing a conductive member having a release groove formed on the surface the conductive member, the release groove forming a prescribed chip area with the one end and the other end of the release groove connected to the peripheral edges of the conductive member, a step of placing a joint material in the chip area, a step of placing a semiconductor chip on the joint material, and a step of bonding the semiconductor chip onto the conductive member by melting the joint material while applying a load to the semiconductor chip, wherein an area ratio of the semiconductor chip to the joint material (chip area/joint material area) is 1.0 or less.

According to this method, solder shrinkage can be prevented regardless of the size of a load applied to a semiconductor chip even in a configuration where chip area/joint material area is 1.0 or less. Since the area of the joint material is relatively large compared to the area of the semiconductor chip, solder leakage is likely to occur. However, even if solder begins to leak, the leaked solder may be introduced into a release groove. In this way, the solder can be prevented from getting on the surface of a semiconductor chip, and thus a decrease in withstand voltage can be minimized.

The release groove is formed with the one end and the other end thereof connected to the peripheral edges of the conductive member, respectively. That is, the one end and the other end of the release groove are opened at the peripheral edges of the conductive member. As such, for example, when forming a release groove by press working on the conductive member, surplus conductive materials pushed out can be released toward an opening end of the release groove. Thereby, the conductive materials pushed out can be prevented from remaining as a protrusion nearby the release groove, and thus a process of removing the protrusion after press working is not required. As a result, an increase in cost required for forming a release groove can be suppressed to a relatively low level.

Further, in an embodiment of the manufacturing method according to the present invention, an area ratio of the semiconductor chip to the joint material (chip area/joint material area) is preferably adjusted between 0.6 and 0.8, inclusive. In an embodiment according to the present invention, it does not matter whether or not a portion of the joint material gets into the release groove.

In an embodiment according to the present invention, a plurality of the release grooves may be formed on the surface of the conductive member, and the semiconductor chips may be arranged in chip areas sandwiched between the plurality of release grooves.

With this configuration, whether the joint material leaks rightward or leftward in the semiconductor chip, a release groove is definitely formed nearby the leak position, and thus a solder can be securely prevented from getting on the surface of the semiconductor chip.

In an embodiment according to the present invention, the plurality of the release grooves may be formed in a stripe shape parallel to each other.

An embodiment according to the present invention may further include a stepped structure formed on the lateral surface of the release groove.

With this configuration, the joint material that gets into the release groove can be prevented from flowing back. Thus, the reliability of withstand voltage in the semiconductor device can be improved.

In an embodiment according to the present invention, the stepped structure is configured such that the release groove is partitioned into a plurality of stages in the depth direction, which may be formed from the one end to the other end of the release groove.

In an embodiment according to the present invention, the conductive member has end surfaces that form the peripheral edges, and the one end and the other end of the release groove may be opened at the end surfaces, respectively.

In an embodiment according to the present invention, the surface of the conductive member is formed in a rectangular shape, and the release groove may be formed along a pair of short sides of the rectangularly shaped conductive member.

With this configuration, the machining dimension of the conductive member for forming the release groove can be shorten compared to a case where the release groove is formed along a pair of long sides. As a result, an increase in cost associated with the formation of the release groove can be further suppressed.

An embodiment according to the present invention may further include a second conductive member arranged above the semiconductor chip, facing the conductive member spaced apart therefrom, and a resin package that seals the semiconductor chip, the conductive member and the second conductive member so as to get into a space between the conductive member and the second conductive member.

With this configuration, a portion of the resin package is sandwiched between the conductive member and the second conductive member to thus allow the portion to be held therebetween. Therefore, the adhesion of the resin package to the semiconductor chip, the conductive member and the second conductive member can be improved.

In an embodiment according to the present invention, the conductive member may have a rear surface exposed from the resin package to serve as a heat sink.

An embodiment according to the present invention may be a power semiconductor module including a high-side assembly, which includes a high-side base member as the conductive member and a high-side switching element as the semiconductor chip arranged on the high-side base member; a low-side assembly, which is arranged away from the high-side assembly and includes a low-side base member as the conductive member and a low-side switching element as the semiconductor chip arranged on the low-side base member; and a resin package for sealing the high-side assembly and the low-side assembly.

In an embodiment according to the present invention, each high-side base member and low-side base member has a rear surface exposed from the resin package, which may serve as a heat sink.

An embodiment according to the present invention may include a high-side terminal integrally formed with the high-side base member so as to project from the resin package, and a low-side terminal arranged above the low-side switching element so as to project from the resin package, facing the low-side base member spaced apart therefrom.

An embodiment according to the present invention may further include a relay member arranged above the high-side switching member, electrically connected to the low-side base member.

An embodiment of the manufacturing method according to the present invention further includes a step of placing a jig with an opening having a planar area smaller than that of the semiconductor chip such that the circumferential edge of the opening comes in contact with the circumferential edge of the semiconductor chip; a step of placing a second joint material on the upper surface of the semiconductor chip exposed through the opening; and a step of arranging a conductive block on the second joint material, and the bonding step may include a step of applying a load to the circumferential edge of the semiconductor chip using the jig.

According to this method, a load may be evenly applied to the semiconductor chip, and thus the joint material can be prevented from beginning to leak biased in a specific direction. Thereby, when the joint material begins to leak, the amount of leaked joint material can be dispersed along the circumferential edge of the semiconductor chip, and thus the solder can be further favorably prevented from getting on the surface of the semiconductor chip.

In an embodiment according to the present invention, the jig may have a guide portion formed by selectively elevating a part of the rear surface thereof from a contact surface in contact with the semiconductor chip, the guide portion surrounding the semiconductor chip.

According to this method, even if a large amount of joint material leaks, the joint material can be securely introduced to a release groove by the guide portion of a jig.

BRIEF DESCRIPTION OF THE DRAWINGS

FIG. 10A and FIG. 10B are views illustrating a part of manufacturing steps of the power semiconductor module shown in FIG. 1. FIG. 10A is a plan view and FIG. 10B is a cross-sectional view.

FIG. 11A and FIG. 11B are views illustrating the next steps of FIG. 10A and FIG. 10B. FIG. 11A is a plan view and FIG. 11B is a cross-sectional view.

FIG. 12A is a plan view and FIG. 12B is a cross-sectional view.

FIG. 13A and FIG. 13B are views illustrating the next steps of FIG. 12A and FIG. 12B. FIG. 13A is a plan view and FIG. 13B is a cross-sectional view.

FIG. 14A and FIG. 14B are views illustrating the next steps of FIG. 13A and FIG. 13B. FIG. 14A is a plan view and FIG. 14B is a cross-sectional view.

EMBODIMENT FOR PRACTICING THE INVENTION

Hereinafter, an embodiment according to the present invention will be specifically discussed with reference to the accompanying drawings.

Figure 1:
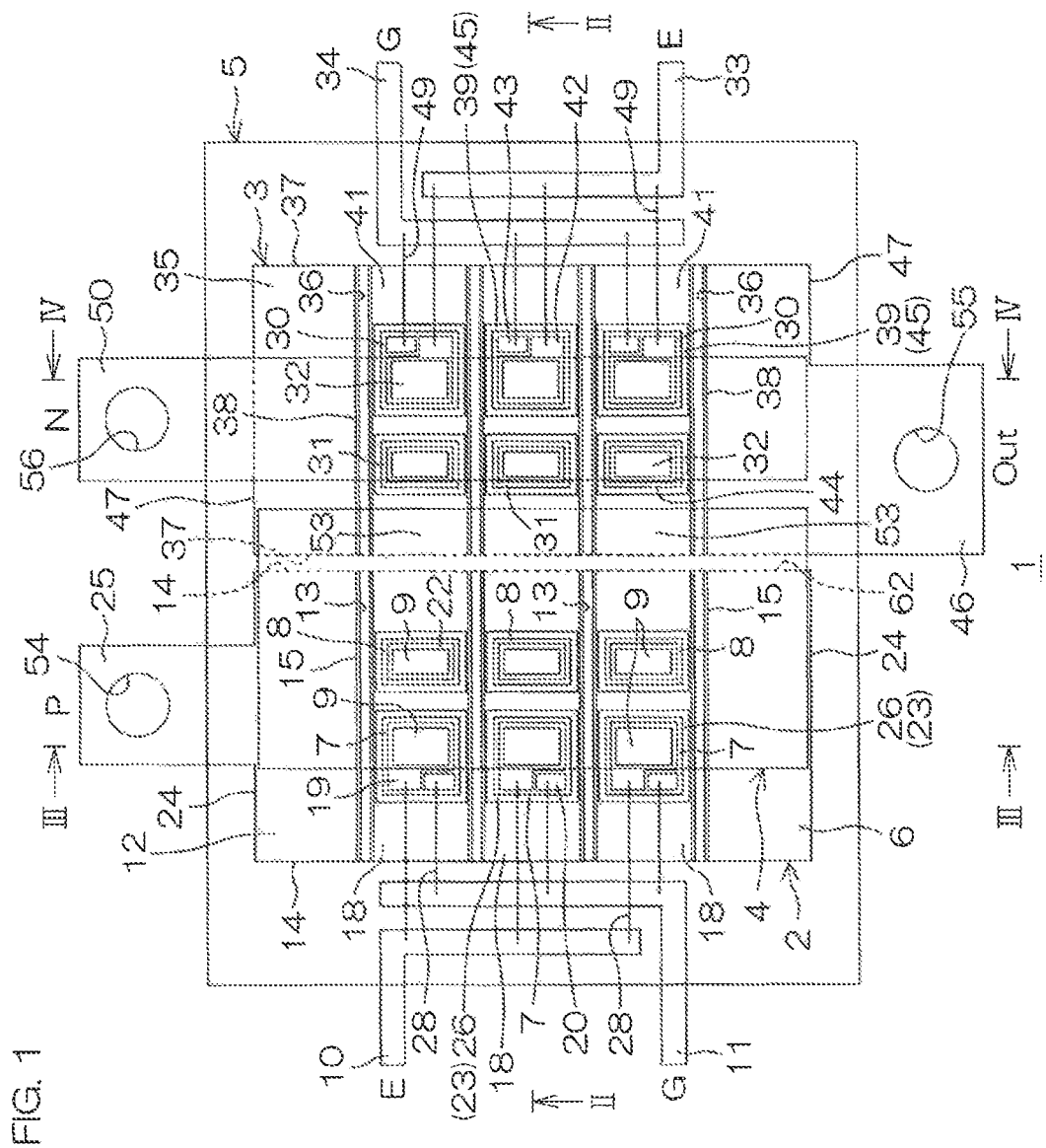
FIG. 1 is a schematic plan view of a power semiconductor module illustrating an embodiment according to the present invention.
Figure 2:
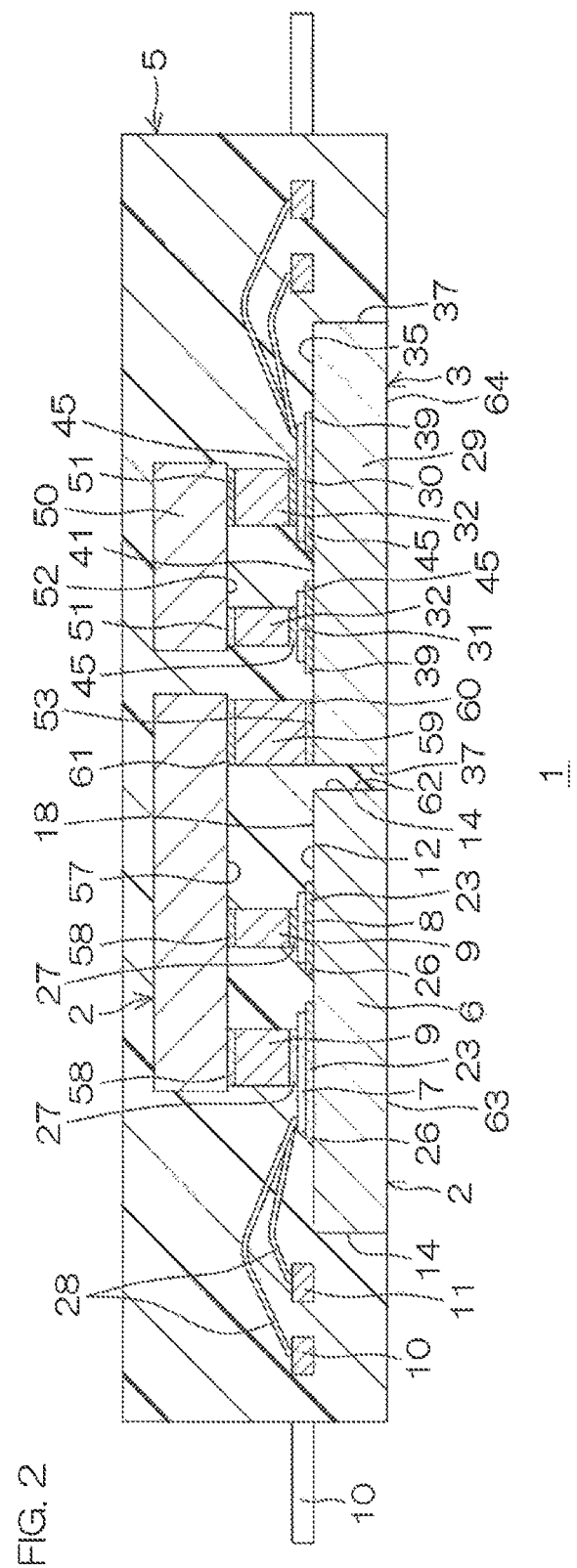
FIG. 2 is a cross-sectional view that appears when cutting the power semiconductor module shown in FIG. 1 along a cutting line II-II.
Figure 3:
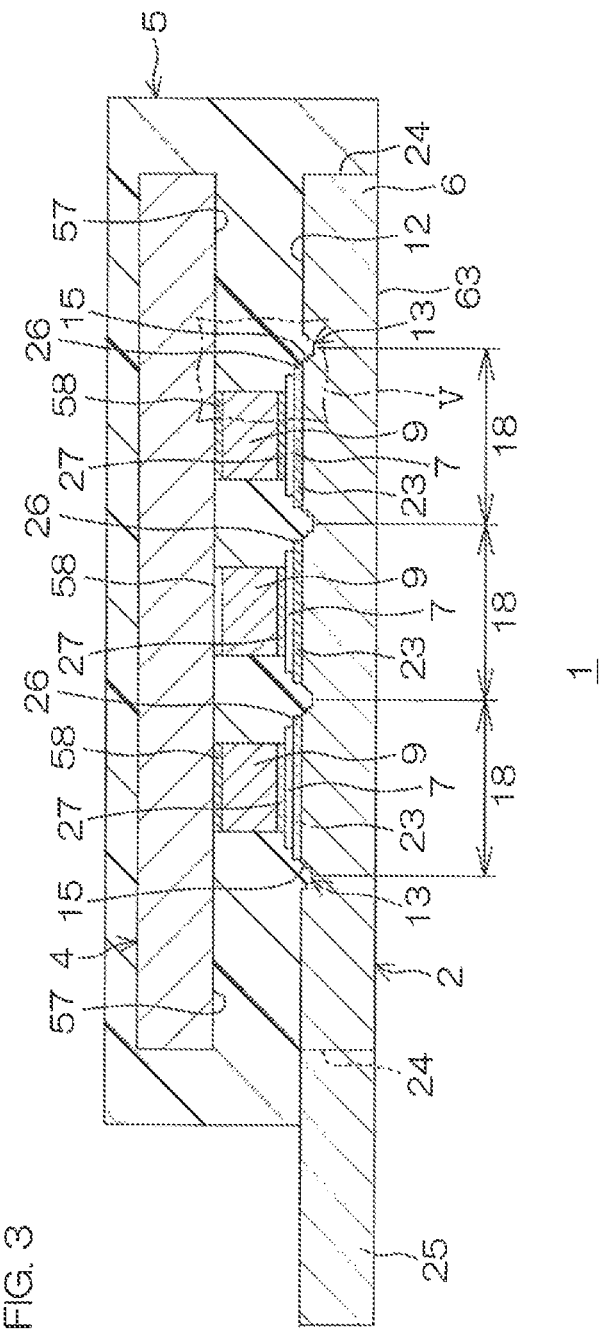
FIG. 3 is a cross-sectional view that appears when cutting the power semiconductor module shown in FIG. 1 along a cutting line III-III.
Figure 4:
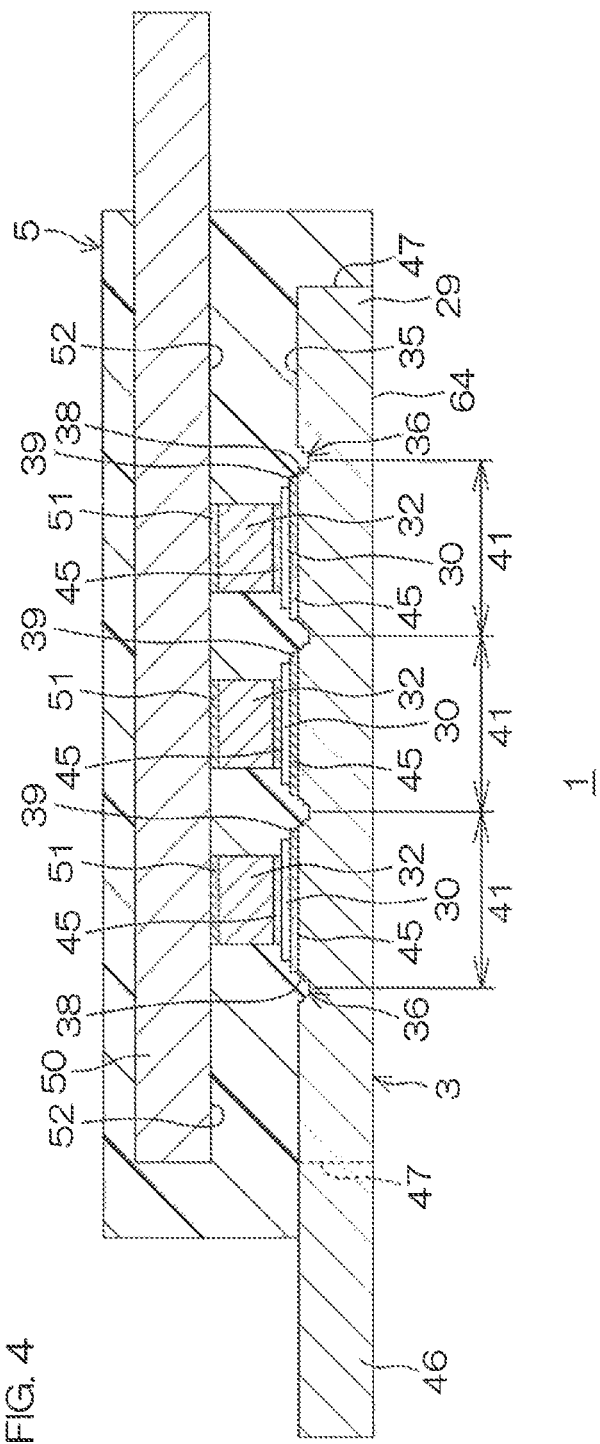
FIG. 4 a cross-sectional view that appears when cutting the power semiconductor module shown in FIG. 1 along a cutting line IV-IV.
Figure 5:
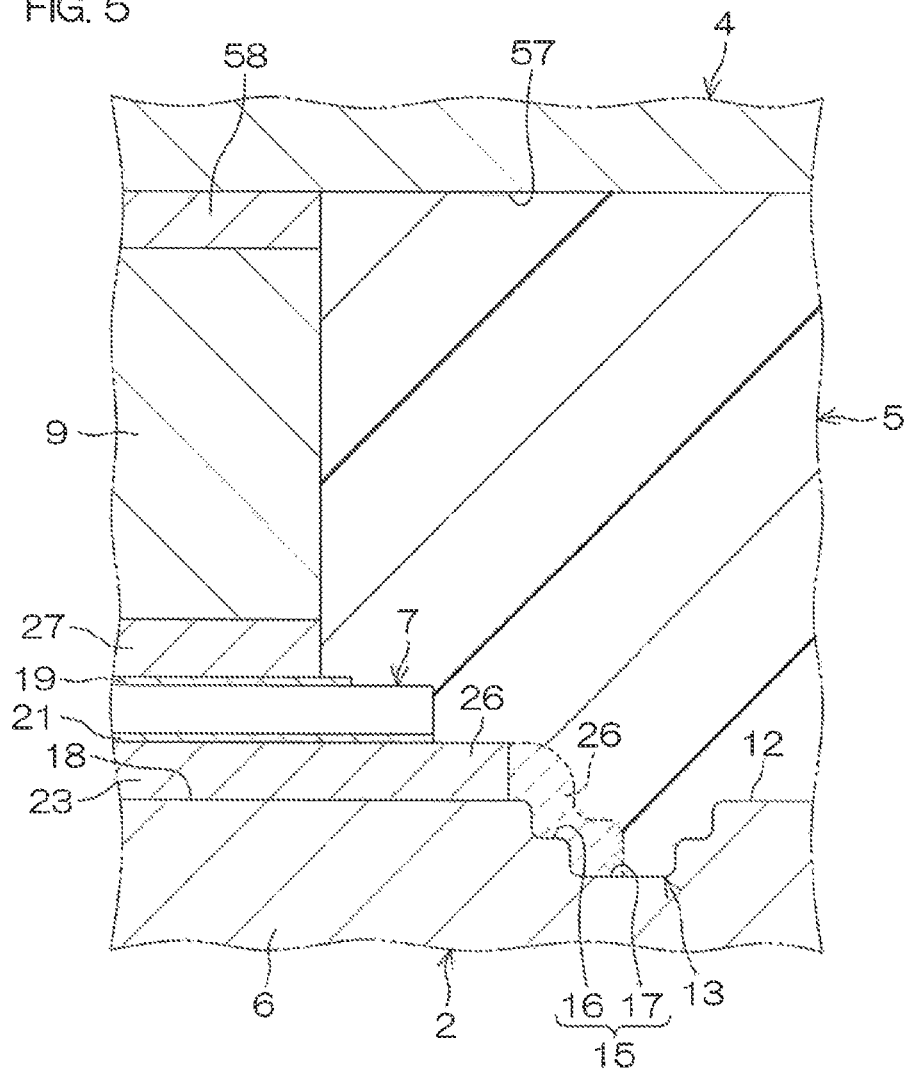
FIG. 5 is an enlarged view of a region surrounded by a dashed line V shown in FIG. 3.

Configuration of a Module According to an Embodiment of the Present Invention FIG. 1 is a schematic plan view of a power semiconductor module 1 illustrating an embodiment according to the present invention. FIG. 2 is a cross-sectional view that appears when cutting the power semiconductor module 1 shown in FIG. 1 along a cutting line II-II. FIG. 3 is a cross-sectional view that appears when cutting the power semiconductor module 1 shown in FIG. 1 along a cutting line III-III. FIG. 4 is a cross-sectional view that appears when cutting the power semiconductor module 1 shown in FIG. 1 along a cutting line IV-IV. FIG. 5 is an enlarged view of a region surrounded by a dashed line V shown in FIG. 3.

The power semiconductor module 1 includes a high-side assembly 2, a low-side assembly 3, a relay terminal 4 as an example of a second conductive member and a relay member according to the present invention, and a resin package 5. The high-side assembly 2 and the low-side assembly 3 are arranged adjacently to each other with a gap 62 therebetween as shown in FIG. 1 and FIG. 2.

The high-side assembly 2 includes a high-side heat dissipation block 6 as an example of the conductive member and the high-side base member according to the present invention, a high-side IGBT 7 (Insulated Gate Bipolar Transistor (IGBT)) and a high-side FRD 8 (Fast Recovery Diode (FRD)) as examples of the semiconductor chip and the high-side switching element according to the present invention, a high-side contact block 9, a high-side emitter terminal 10, and a high-side gate terminal 11. Hereinafter, the high-side IGBT 7 and the high-side FRD 8 may be simply referred to as a chip 7 and a chip 8 (the same is true for the later-described low-side IGBT 30 and low-side FRD 31).

The high-side heat dissipation block 6 is composed of, for example, copper (Cu). In this embodiment, the high-side heat dissipation block 6 is formed in a slightly-flat rectangular parallelepiped shape (rectangular shape in plan view).

A plurality of release grooves 13 is formed on the surface 12 of the high-side heat dissipation block 6. Here, the release grooves 13 are shallowly formed in a region near the surface 12 (surface part) of the high-side heat dissipation block 6. In other words, a metal part is thickly remained below the relatively shallow release grooves 13 in the high-side heat dissipation block 6. This structure may prevent the high-side heat dissipation block 6 from being bent along the release grooves 13 due to heat, stress and so forth. For example, when the high-side heat dissipation block 6 has a thickness of 1 mm to 20 mm, the release grooves 13 may have a depth of approximately 0.01 mm to 2 mm.

In this embodiment, each release groove 13 is formed along a pair of short sides of the high-side heat dissipation block 6 so as to connect both the end surfaces 14 of a pair of long sides of the high-side heat dissipation block 6 as shown in FIG. 1. Thereby, the one end and the other end of each release groove 13 are opened at the end surfaces 14 of the high-side heat dissipation block 6, respectively.

Further, a stepped structure 15 is formed on the lateral surface of each release groove 13. In this embodiment, the stepped structure 15 is configured such that the release groove 13 is partitioned into two stages in the depth direction as shown in FIG. 5. Thereby, the stepped structure 15 includes a first groove 16 and a second groove 17 formed by the bottom of the first groove 16 further dented, having a width narrower than that of the first groove 16. The stepped structure 15 is continuously formed along the longitudinal direction of the release groove 13 from the one side end surface 14 to the other side end surface 14 of the high-side heat dissipation block 6 as shown in FIG. 1.

The number of stages of the stepped structure 15 is not limited to two, but may be three, four or more. Further, a plurality of grooves (first groove 16 and second groove 17 in this embodiment) may have mutually the same depth or mutually different depths. The stepped structure 15 may be selectively formed along the longitudinal direction of the release groove 13. For example, a plurality of the second grooves 17 may be formed spaced apart from each other along the longitudinal direction of the release groove 13. Furthermore, the stepped structure 15 does not need to be formed.

With such release grooves 13 formed spaced apart from each other along the long side of the high-side heat dissipation block 6, the surface 12 of the high-side heat dissipation block 6 is divided into a plurality of regions. In this embodiment, four release grooves 13 are formed parallel to each other as shown in FIG. 1. Thereby, three chip areas 18 are formed in a rectangular shape in plan view sandwiched between adjacent release grooves 13 on the surface 12 of the high-side heat dissipation block 6.

Each one of the high-side IGBT 7 and the high-side FRD 8 is arranged in each chip area 18. Specifically, the high-side IGBT 7 and the high-side FRD 8 are arranged with a distance therebetween along the release groove 13 in this order away from the low-side assembly 3. A prescribed gap is formed between the release groove 13, and the high-side GBT 7 and the high-side FRD 8.

The high-side IGBT 7 has an emitter pad 19 and a gate pad 20 on the upper surface, and has a collector pad 21 on the rear surface. Whereas, the high-side FRD 8 has an anode pad 22 on the upper surface, and has a cathode pad (not shown) on the rear surface. The rear surfaces of the high-side IGBT 7 and the high-side FRD 8 are bonded onto the high-side heat dissipation block 6 using a solder material 23 as an example of the joint material according to the present invention. Thereby, the collector of the high-side IGBT 7 and the cathode of the high-side FRD 8 are electrically connected to the high-side heat dissipation block 6, respectively. For the sake of clarity, the emitter pad 19, the gate pad 20, and the collector pad 21 are not shown in FIG. 2 and FIG. 3.

The solder material 23 is provided between the high-side heat dissipation block 6, and the high-side IGBT 7 and the high-side FRD 8. Further, the solder material 23 may have a leaked portion 26 leaked outside the circumferential edge of the high-side IGBT 7 and the high-side FRD 8. The leaked portion 26 may get in the release groove 13, for example, as shown by a dashed line in FIG. 5.

Further, a positive (P) terminal 25 as an example of the high-side terminal of the present invention is integrally connected to the high-side heat dissipation block 6. The P terminal 25 is connected to a positive side of a circuit power supply. A power supply voltage supplied from the p terminal 25 is applied to the collector of the high-side IGBT 7 and the cathode of the high-side FRD 8 via the high-side heat dissipation block 6. In this embodiment, as shown in FIG. 3, the P terminal 25 projects from the end surface 24 of the short side of the high-side heat dissipation block 6 with the same thickness as that of the high-side heat dissipation block 6, extending from the inside to the outside of the resin package 5. That is, the P terminal 25 is connected to the end surface 24 different from the end surface 14 at which the release groove 13 of the high-side heat dissipation block 6 is opened. A through-hole 54 is formed in the exposed portion of the P terminal 25.

The high-side contact block 9 is composed of, for example, copper (Cu). Each high-side contact block 9 is arranged on the emitter pad 19 of the high-side IGBT 7 and on the anode pad 22 of the high-side FRD 8 using the solder material 27. Thereby, the high-side contact block 9 is electrically connected to the emitter pad 19 of the high-side IGBT 7 and the anode pad 22 of the high-side FRD 8.

The high-side emitter terminal 10 and the high-side gate terminal 11 are arranged at the opposite side of the low-side assembly 3 across the high-side heat dissipation block 6, extending from the inside to the outside of the resin package 5. The high-side emitter terminal 10 and the high-side gate terminal 11 are electrically connected to the emitter pad 19 and the gate pad 20 using a bonding wire 28, respectively.

The low-side assembly 3 includes a low-side heat dissipation block 29 as an example of the conductive member and the low-side base member according to the present invention, a low-side IGBT 30 and a low-side FRD 31 as examples of the semiconductor chip and the low-side switching element according to the present invention, a low-side contact block 32, a low-side emitter terminal 33, a low-side gate terminal 34, and a negative (N) terminal 50 as an example of a low-side terminal according to the present invention.

The low-side heat dissipation block 29 is composed of, for example, copper (Cu). In this embodiment, the low-side heat dissipation block 29 is formed in a slightly-flat rectangular parallelepiped shape (rectangular shape in plan view) similarly to the high-side heat dissipation block 6. The high-side heat dissipation block 6 and the low-side heat dissipation block 29 are adjacently arranged with the end surfaces 14, 37 of the long sides thereof facing each other.

A plurality of release grooves 36 is formed on the surface 35 of the low-side heat dissipation block 29. Here, the release grooves 36 are shallowly formed in a region near the surface 35 (surface part) of the low-side heat dissipation block 29. In other words, a metal part is thickly remained below the relatively shallow release grooves 36 in the low-side heat dissipation block 29. This structure may prevent the low-side heat dissipation block 29 from being bent along the release grooves 36 due to heat, stress and so forth. For example, when the low-side heat dissipation block 29 has a thickness of 1 mm to 20 mm, the release grooves 36 may have a depth of approximately 0.01 mm to 2 mm.

In this embodiment, each release groove 36 is formed along a pair of short sides of the low-side heat dissipation block 29 so as to connect both the end surfaces 37 of a pair of long sides of the low-side heat dissipation block 29 as shown in FIG. 1. Thereby, the one end and the other end of each release groove 36 are opened at the end surfaces 37 of the low-side heat dissipation block 29, respectively.

Further, a stepped structure 38 is formed on the lateral surface of each release groove 36. In this embodiment, the stepped structure 38 is configured such that the release groove 36 is partitioned into two stages in the depth direction similarly to the stepped structure 15 as shown in FIG. 5. That is, the stepped structure 38 includes a first groove and a second groove (not shown) having the same structures as those of the first groove 16 and the second groove 17 shown in FIG. 5. The stepped structure 38 is continuously formed along the longitudinal direction of the release groove 36 from the one side end surface 37 to the other side end surface 37 of the low-side heat dissipation block 29 as shown in FIG. 1.

With such release grooves 36 formed spaced apart from each other along the long side of the low-side heat dissipation block 29, the surface 35 of the low-side heat dissipation block 29 is divided into a plurality of regions. In this embodiment, four release grooves 36 are formed parallel to each other. Thereby, three chip areas 41 are formed in a rectangular shape in plan view sandwiched between adjacent release grooves 36 on the surface 35 of the low-side heat dissipation block 29. The release grooves 36 may be formed along the longitudinal direction of the release groove 13 of the high-side heat dissipation block 6 as shown in FIG. 1 or may be formed along a direction orthogonal to the longitudinal direction of the release groove 13.

Each one of the low-side IGBT 30 and the low-side FRD 31 is arranged in each chip area 41. Specifically, the low-side IGBT 30 and the low-side FRD 31 are arranged with a distance therebetween along the release groove 36 in this order away from the high-side assembly 2. A prescribed gap is formed between the release groove 36, and the low-side GBT 30 and the low-side FRD 31.

The low-side IGBT 30 has an emitter pad 42 and a gate pad 43 on the upper surface, and has a collector pad (not shown) on the rear surface. Whereas, the low-side FRD 31 has an anode pad 44 on the upper surface, and has a cathode pad (not shown) on the rear surface. The rear surfaces of the low-side IGBT 30 and the low-side FRD 31 are bonded onto the low-side heat dissipation block 29 using a solder material 45 as an example of the joint material according to the present invention. Thereby, the collector of the low-side IGBT 30 and the cathode of the low-side FRD 31 are electrically connected to the low-side heat dissipation block 29, respectively.

The solder material 45 is provided between the low-side heat dissipation block 29, and the low-side IGBT 30 and the low-side FRD 31. Further, the solder material 45 may have a leaked portion 37 leaked outside the circumferential edge of the low-side IGBT 30 and the low-side FRD 31 similarly to the solder material 23. The leaked portion 39 may get in the release groove 36 similarly to the leaked portion 26 as shown in FIG. 5.

Further, an output terminal 46 is integrally connected to the low-side heat dissipation block 29. The output terminal 46 is connected to the load of a circuit. In this embodiment, the output terminal 46 projects from the end surface 47 of the short side of the low-side heat dissipation block 29 with the same thickness as that of the low-side heat dissipation block 29, extending from the inside to the outside of the resin package 5 as shown in FIG. 4. That is, the output terminal 46 is connected to the end surface 47 different from the end surface 37 at which the release groove 36 of the low-side heat dissipation block 29 is opened. Further, in this embodiment, the end surface 47 to which the output terminal 46 is connected is the end surface 47 on the opposite side of the end surface 47 adjacent to the P terminal 25. Thereby, the output terminal 46 extends in a direction opposite to the P terminal 25. A through-hole 55 is formed in the exposed portion of the output terminal 46.

The low-side contact block 32 is composed of, for example, copper (Cu). Each low-side contact block 32 is arranged on the emitter pad 42 of the low-side IGBT 30 and the anode pad 44 of the low-side FRD 31 using the solder material 45. Thereby, the low-side contact block 32 is electrically connected to the emitter pad 42 of the low-side IGBT 30 and the anode pad 44 of the low-side FRD 31.

The low-side emitter terminal 33 and the low-side gate terminal 34 are arranged at the opposite side of the high-side assembly 2 across the low-side heat dissipation block 29, extending from the inside to the outside of the resin package 5. The low-side emitter terminal 33 and the low-side gate terminal 34 are electrically connected to the emitter pad 42 and the gate pad 43 using a bonding wire 49, respectively.

An N terminal 50 is composed of, for example, copper (CU), and is formed in a block shape with the same thickness as that of the high-side heat dissipation block 6 and the low-side heat dissipation block 29. The N terminal 50 is connected to all the low-side contact blocks 32 on the low-side IGBT 30 and the low-side FRD 31 using the solder material 51.

Specifically, the N terminal 50 extends along the long side of the low-side heat dissipation block 29 to traverse a plurality of chip areas 41 in plan view. The longitudinal placement area of the N terminal 50, for example, extends from one end surface 47 of the low-side heat dissipation block 29 to the outside of the resin package 5. Thereby, the N terminal 50 projects from the resin package 5 while forming a space 52 with the low-side heat dissipation block 29 inside the resin package 5. A through-hole 56 is formed in the exposed portion of the N terminal 50. In this embodiment, the projection direction of the N terminal 50 is the same as the projection direction of the P terminal 25, that is, the projection direction of the N terminal 50 is opposite to the projection direction of the output terminal 46 included in the same low-side assembly 3. Thereby, the N terminal 50 and the output terminal 46 do not overlap each other, and thus do not interfere with each other.

Meanwhile, the N terminal 50 is formed narrower in width than the low-side heat dissipation block 29. The difference in the width direction between the N terminal 50 and the low-side heat dissipation block 29 allows a contact area 53 to be formed on the low-side heat dissipation block 29, the contact area laterally extending from the N terminal 50 and forming a part of the chip area 41.

The N terminal 50 is connected to the negative side of a power supply circuit. The power supply voltage supplied from the N terminal 50 is applied to the emitter of the low-side IGBT 30 and the anode of the low-side FRD31 via the low-side contact block 32.

The relay terminal 4 is composed of, for example, copper (Cu) and is formed with the same thickness as the high-side heat dissipation block 6 and the low-side heat dissipation block 29. The relay terminal 4 is arranged above the high-side heat dissipation block 6 and the low-side heat dissipation block 29 extending across both components. Thereby, the relay terminal 4 forms a space 57 with the high-side heat dissipation block 6 and the low-side heat dissipation block 29. Specifically, the relay terminal 4 extends along the long side of the high-side heat dissipation block 6 and the low-side heat dissipation block 29, traversing a plurality of chip areas 18, 41 in plan view. The longitudinal placement area of the relay terminal 4, for example, extends from the one end surface 24, 47 to the other end surface 24, 47 of each heat dissipation block 6, 29.

The relay terminal 4 is bonded onto all the high-side contact blocks 9 on the high-side IGBT 7 and the high-side FRD 8 in the high-side assembly 2 using the solder material 58. Meanwhile, the relay terminal 4 is bonded onto the low-side heat dissipation block 29 in the low-side assembly 3 using the relay block 59.

Each relay block 59 is arranged in each contact area 53 of the low-side heat dissipation block 29 via a solder material 60. Each solder material 61 is provided between each relay block 59 and the relay terminal 4.

As shown in FIG. 2, a current flows from the emitter of the high-side IGBT 7 and the anode of the high-side FRD 8 to the collector of the low-side IGBT 30 and the cathode of the low-side FRD 31 through the relay terminal 4, the relay block 59, and the low-side heat dissipation block 29.

The resin package 5 is, for example, an epoxy resin. The resin package 5 covers the high-side assembly 2, the low-side assembly 3, the relay terminal 4 and so forth so as to expose each rear surface 63, 64 of the high-side heat dissipation block 6 and the low-side heat dissipation block 29. The heat generated in each chip 7, 8, 30, 31 is diffused from the rear surfaces 63, 64 of the high-side heat dissipation block 6 and the low-side heat dissipation block 29. Further, in this embodiment, a part of the resin package 5 gets into the space 52, 57. Thereby, the part of the resin package 5 is sandwiched and held between the lower side conductive member (high-side heat dissipation block 6 and low-side heat dissipation block 29) and the upper side conductive member (relay terminal 4 and N terminal 50). As a result, the adhesion of the resin package 5 to the high-side assembly 2, low-side assembly 3, the relay terminal 4 and so forth can be improved.

Pre-evaluation To Come Up With The Present Invention

Figure 6:
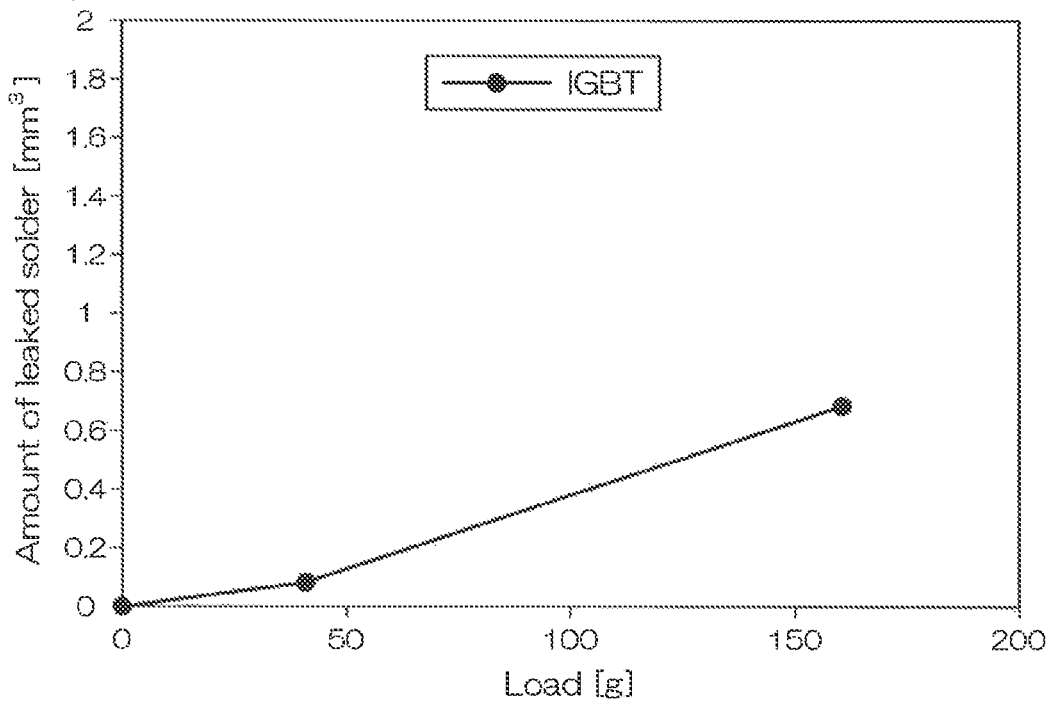
FIG. 6 is a line graph illustrating a relationship between a load applied to a semiconductor chip and an amount of leaked solder.
Figure 7:
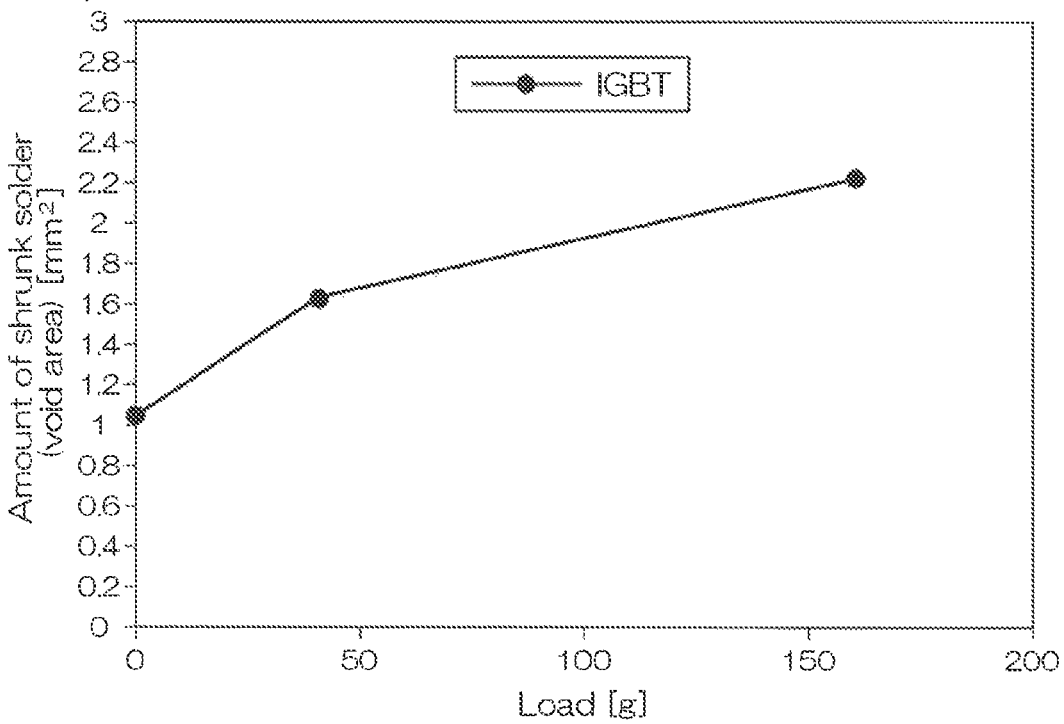
FIG. 7 is a line graph illustrating a relationship between a load applied to a semiconductor chip and an amount of shrunk solder.
Figure 8:
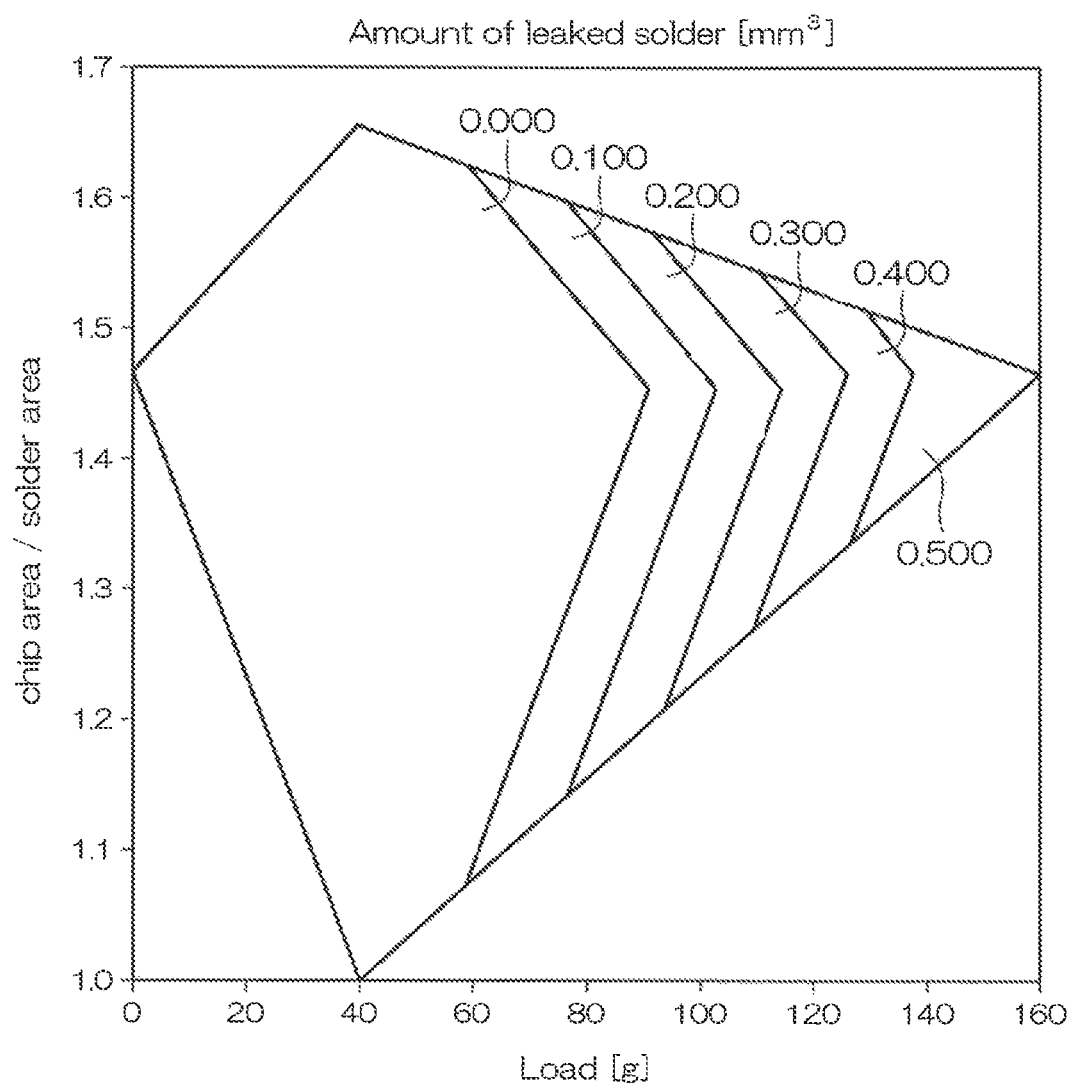
FIG. 8 is a contour graph illustrating the distribution of an amount of leaked solder when a load applied to a semiconductor chip and chip area/solder area are varied.
Figure 9:
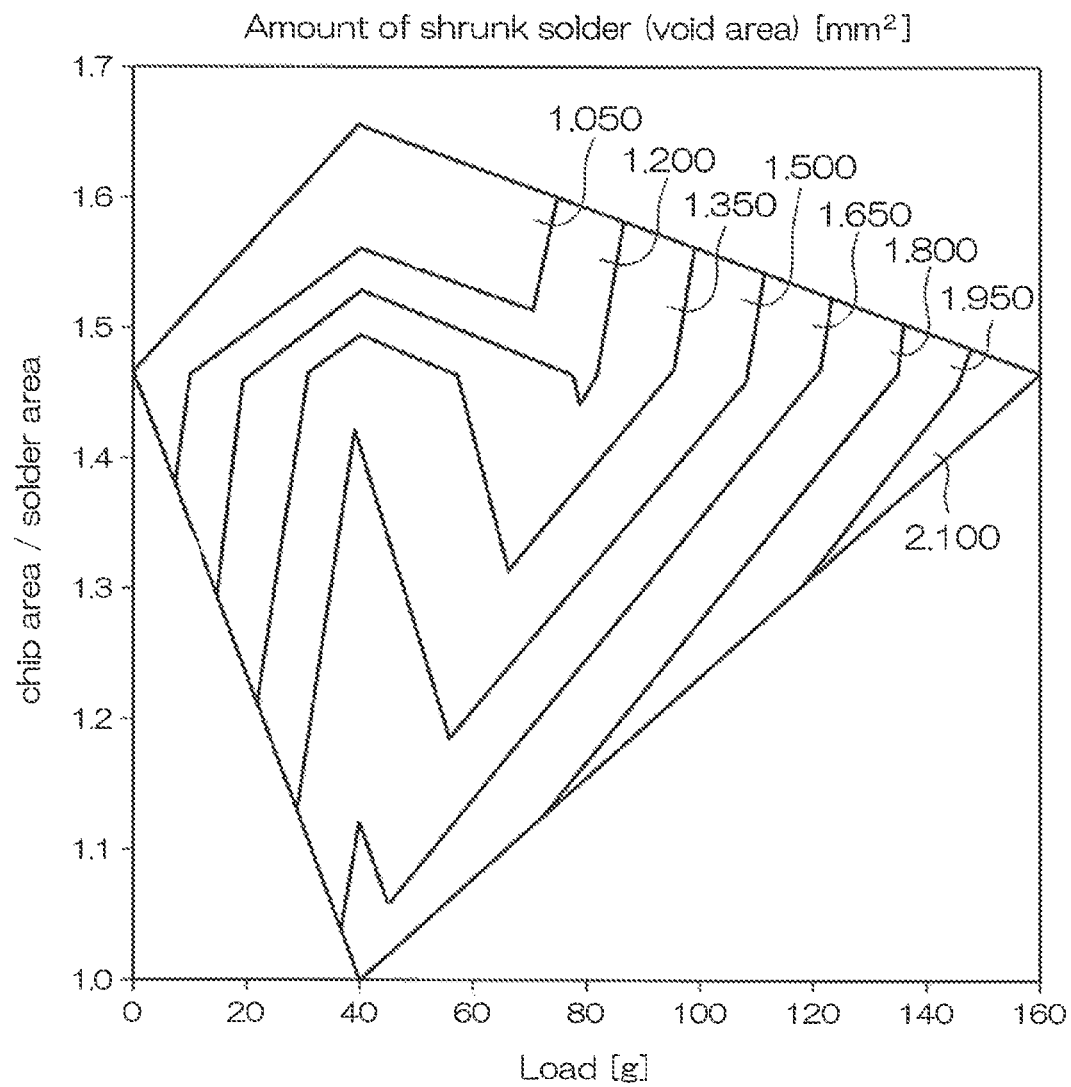
FIG. 9 is a contour graph illustrating the distribution of an amount of shrunk solder when a load applied to a semiconductor chip and chip area/solder area are varied.

The inventors of the present invention have evaluated the relationship between an amount of leaked solder (an amount of shrunk solder) and a load applied to a semiconductor chip (IGBT) by experiment to determine the cause of solder leakage and solder shrinkage in the bonding of a semiconductor chip. The results are shown in FIGS. 6-9. FIGS. 6-7 are line graphs representing the relationship between a load applied to a semiconductor chip and an amount of leaked solder (an amount of shrunk solder). Here, an amount of leaked solder (an amount of shrunk solder) with respect to a semiconductor chip is considered, but the later-described release groove is not taken into account. FIG. 8 and FIG. 9 are a contour graph illustrating the distribution of an amount of leaked solder (an amount of shrunk solder) when a load applied to a semiconductor chip and chip area/solder area are varied. A contour line is input within the range of experiment. In FIG. 8 and FIG. 9, the numerical values put on each lead line represent the amounts of leaked solder ($mm^3$) and the amounts of shrunk solder ($mm^2$) in the regions indicated by the lead lines.

According to FIGS. 6-9, it was found that the smaller the load is, the more effectively the solder leakage can be suppressed regardless of the size of the chip area/solder area. Although conventionally it was thought that the shortage of a load applied to a semiconductor chip and the shortage of an amount of solder could cause solder shrinkage, it was found that solder shrinkage cannot be completely controlled only by an applied load and an amount of solder. For example, according to the data (IGBT) shown in FIG. 7, the solder shrinkage increases from approximately 1.6 mm$^2$ to approximately 2.2 mm$^2$ despite an increase in applied load from 40 g to 160 g. That is, although conventionally it was thought that there is a conflicting relation between solder leakage and solder shrinkage, it was found that the conflicting relation is not necessarily applicable in every case according to FIG. 6 to FIG. 9.

Here, the inventors of this application are motivated to form the release grooves 13, 36 with both ends opened in the high-side heat dissipation block 6 and the low-side heat dissipation block 29 as previously described, while setting the value of chip area/solder area in manufacturing steps within a suitable range. Thereby, it was found that a semiconductor device can be provided, which is capable of preventing solder shrinkage while minimizing a decrease in withstand voltage at low cost.

Steps of Manufacturing a Module According to an Embodiment of the Present Invention Hereinafter, as a result of reviewing FIGS. 6-9, the specific aspect of the bonding of semiconductor chips in the steps of manufacturing a semiconductor device will be discussed by taking the above-described high-side assembly 2 as an example.

FIG. 10A, FIGS. 10B-14A, and FIG. 14B are views illustrating a part of manufacturing steps of the power semiconductor module 1 shown in FIG. 1 in order of steps (manufacturing steps of high-side assembly 2). FIG. 10A is a plan view corresponding to FIG. 1, and FIG. 10B is a cross-sectional view corresponding to FIG. 5. Some reference numerals shown in FIG. 1 and FIG. 5 are omitted in FIG. 10A, FIGS. 10B-14A, and FIG. 14B for the sake of clarity.

When manufacturing the high-side assembly 2, first, the high-side heat dissipation block 6 with a release groove 13 formed thereon is prepared as shown in FIG. 10A and FIG. 10B. The release groove 13 may be formed on the surface 12 of the high-side heat dissipation block 6, for example, by press working after the high-side heat dissipation block 6 is molded.

Next, as shown in FIG. 11A and FIG. 11B, plate shaped solder 65 as an example of the joint material according to the present invention is placed at a prescribed position in the chip area 18. The size of the plate shaped solder 65 is adjusted such that the ratio of the areas of the high-side GBT 7 and the high-side FRD 8 to the solder area (chip area/solder area) is 1 or less. In this embodiment, the plate shaped solder 65 that is smaller in size than each chip 7, 8 is used within the above described range. Solder paste may be used in place of the plate shaped solder 65.

Figure 12A:
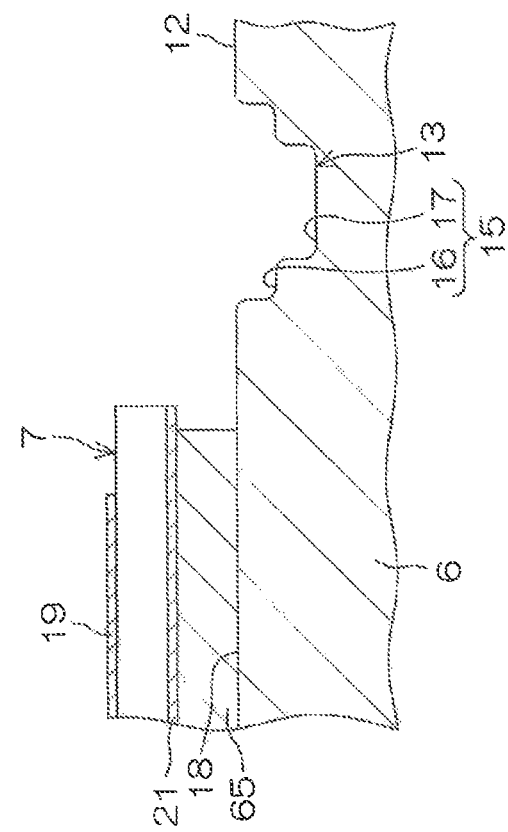
FIG. 12A and FIG. 12B are views illustrating the next steps of FIG. 11A and FIG. 11B.
Figure 12B:
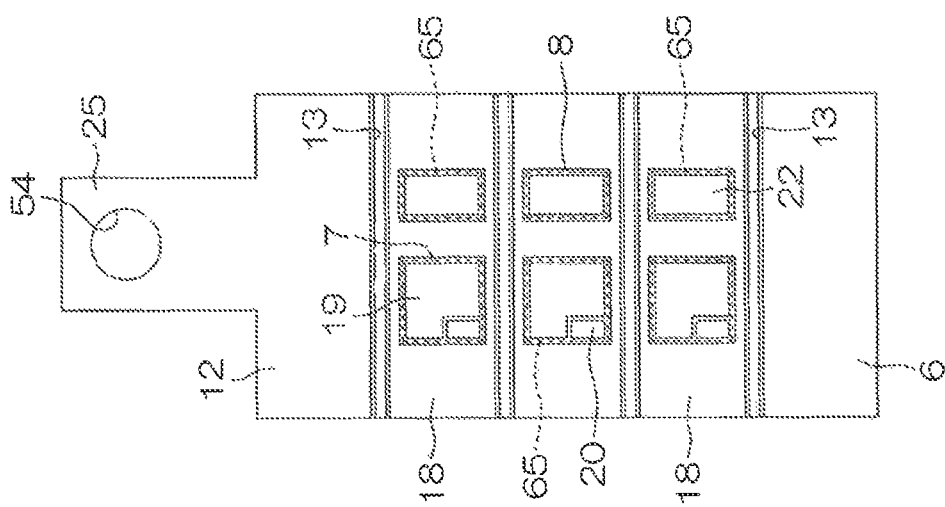

Next, the high-side IGBT 7 and the high-side FRD 8 are placed on each plate shaped solder 65, respectively as shown in FIG. 12A and FIG. 12B.

Next, as shown in FIG. 13A and FIG. 13B, a jig 66 is set to apply a load to the high-side heat dissipation block 6.

The jig 66 has a plurality of openings 67 in accordance with the arrangement pattern of the high-side IGBT 7 and the high-side FRD 8. Each opening has an area smaller than the areas of the high-side IGBT 7 and the high-side FRD 8. Further, the jig 66 has a guide portion 69 selectively elevated from a circumferential edge 68 of the opening 67 at a portion facing the release groove 13. The guide portion 69 may be formed in a stripe shape as in the release groove 13, or may be selectively formed in the periphery of the opening 67.

The jig 66 is placed to allow the circumferential edge 68 of the opening 67 to come in contact with the circumferential edge of each chip 7, 8 with each opening 67 aligned with each chip 7, 8. In this state, plate shaped solder 70 as an example of a second joint material according to the present invention and a high-side contact block 9 as an example of the conductive block according to the present invention are further placed on each chip 7, 8 exposed through the opening 67.

Next, as shown in FIG. 14A and FIG. 14B, the high-side contact block 9 and the jig 66 are heated while a load is applied thereto. Thereby, the molten plate shaped solder 65 is pressed and crushed by each chip 7, 8, and spreads to form the solder material 23. Also, the plate shaped solder 70 is melted to form the solder material 27. At this time, the circumferential edge of each chip 7, 8 is pressed by the circumferential edge 68 of the opening of the jig 66, and thus a load may be evenly applied to the chips 7, 8. As a result, molten solder can be prevented from leaking biased in a specific direction. Thus, the leaked mount of solder 23 can be dispersed along the circumferential edge of the chips 7, 8. The high-side assembly 2 can be obtained by following the steps described above.

The power semiconductor module 1 can be manufactured by obtaining the low-side assembly 3 in the same manner as the high-side assembly 2, connecting both assemblies 2, 3 with the relay terminal 4, thereafter sealing these assemblies with the resin package 5.

According to the manufacturing method described above, in the bonding of the high-side IGBT 7 and the high-side FRD 8, the area ratio of the chips 7, 8 to the plate shaped solder 65 (chip area/solder area) is set to 1 or less. Thereby, solder shrinkage can be suppressed regardless of the size of a load applied to the high-side IGBT 7 and the high-side FRD 8. Particularly, solder shrinkage can be prevented by reducing the area ratio to 0.8 or less and increasing the amount of solder.

Meanwhile, since the area of the plate shaped solder 65 is relatively large compared to the area of the chips 7, 8, solder leakage from the chips 7, 8 may occur as shown in FIG. 14. However, even if solder begins to leak, the solder may be introduced to the release groove 13. Particularly, in this embodiment, the release groove 13 is formed on both sides of each chip area 18 while the guide portion 69 is formed in the jig 66. As such, the solder that begins to leak can be introduced in the release groove 13. That is, when the solder leakage to the outside of area including the release groove 13 (outside solder leakage) is assumed here, the outside solder leakage can be reduced to zero with the area ratio set no greater than 1. As a result, a portion of the solder material 23 can be prevented from getting on the surface of the chips 7, 8, and thus a decrease in withstand voltage can be minimized. Meanwhile, if the area ratio is less than 0.6, surplus solder overflows from the open end of the release groove 13, and therefore the area ratio is preferably 0.6 or greater.

The one end and the other end of each release groove 13 are respectively opened at the end surfaces 14 of the high-side heat dissipation block 6. Therefore, for example, when the release groove 13 is formed by press wording on the high-side heat dissipation block 6, the surplus copper material pushed out can be released toward the open end of the release groove 13. Thereby, the copper material pushed out can be suppressed from remaining as a protrusion in the periphery of the release groove 13, and thus machining work after press working for removing the protrusion is not required. As a result, an increase in cost necessary for forming the release groove 13 can be reduced to a relatively low level. Further, in this embodiment, the release groove 13 is formed along the short side of the high-side heat dissipation block 6. Accordingly, the machining dimension of the high-side heat dissipation block 6 for forming the release groove 13 can be shorten compared to a case where the release groove 13 is formed along the long side. As a result, an increase in cost associated with the formation of the release groove 13 can be further minimized.

Once solder gets into the release groove 13, the solder can be introduced by its own weight to the second groove 17 located at a relatively deep position. Thus, provided that the amount of leaked solder has approximately the same volume as that of the second groove 17, the whole amount of leaked solder can be stored in the deepest area (second groove 17) in the release groove 13. Thereby, the solder in the release groove 13 is prevented from flowing back, and thus the reliability of withstand voltage can be improved.

An embodiment according to the present invention has been described as above, however, the present invention may be practiced also in other embodiments.

For example, in the previously described embodiment, an example is shown in which the release grooves 13, 36 are formed in the high-side heat dissipation block 6 and the low-side heat dissipation block 29, which are used as a heat sink. However, the structure such as the release grooves 13, 36 can also be formed, for example, in the island of a lead frame.

Further, the high-side heat dissipation block 6 and the low-side heat dissipation block 29 do not need to be formed in a rectangular shape in plan view. For example, these blocks may be formed in other polygonal shapes (for example, triangular shape, pentagonal shape) or in a circular shape.

Further, the release grooves 13, 36 do not need to be formed in a stripe shape, but may be formed, for example in a meander pattern.

Further, the present invention may be applied to other module products, discrete products and so forth, not limited to a power semiconductor module.

It is to be understood that variations and modifications can be made without departing from the scope and spirit of the present invention.

This application corresponds to Patent Application No. 2014-041862 submitted to Japanese Patent Office on Mar. 4, 2014, and the entire contents of this application are hereby incorporated by reference.

DESCRIPTION OF THE REFERENCE NUMERALS

1 Power semiconductor module
2 High-side assembly
3 Row-side assembly
4 Relay terminal
5 Resin package
6 High-side heat dissipation block
7 High-side IGBT
8 High-side FRD
9 High-side contact block
12 (High-side heat dissipation block) surface
13 Release groove
14 (Long side of high-side heat dissipation block) end surface
15 Stepped structure
16 First groove
17 Second groove
18 Chip area
23 Solder material
24 (Short side of high-side heat dissipation block) end surface
25 P terminal
26 Leaked portion
27 Solder material
29 Low-side heat dissipation block
30 Low-side IGBT
31 Low-side FRD
32 Low-side contact block
35 (Low-side heat dissipation block) surface
36 Release groove
37 (Long side of low-side heat dissipation block) end surface
38 Stepped structure
39 Leaked portion
41 Chip area
45 Solder material
46 Output terminal
47 (Short side of low-side heat dissipation block) end surface
50 N terminal
51 Solder material
52 Space
53 Contact area
57 Space
59 Relay block
63 (High-side heat dissipation block) rear surface
64 (Low-side heat dissipation block) rear surface
65 Plate shaped solder
66 Jig
67 (Jig) opening
68 (Jig opening) circumferential edge
69 Guide portion
70 Plate shaped solder

What is claimed is:

1. A semiconductor device comprising:
a first metallic base portion;
a first semiconductor chip, a second semiconductor chip and a third semiconductor chip disposed on the first metallic base portion such that the first semiconductor chip, the second semiconductor chip and the third semiconductor chip are spaced from each other in a first direction, each of the first semiconductor chip, the second semiconductor chip and the third semiconductor chip having a substantially rectangular shape in a plan view, and the second semiconductor chip having a first pad and a second pad;
a fourth semiconductor chip disposed on a first region of the first metallic base portion in which the first semiconductor chip is disposed;
a fifth semiconductor chip disposed on a second region of the first metallic base portion in which the second semiconductor chip is disposed;
a sixth semiconductor chip disposed on a third region of the first metallic base portion in which the third semiconductor chip is disposed;
a bonding material connecting each of the first semiconductor chip, the second semiconductor chip, the third semiconductor chip, the fourth semiconductor chip, the fifth semiconductor chip and the sixth semiconductor chip with the first metallic base portion;
a first groove formed on the first metallic base portion such that the first groove is disposed between the first region and the second region, the first groove being longer than a first side of the first semiconductor chip and a first side of the second semiconductor chip, each of which faces the first groove;

a second groove formed on the first metallic base portion such that the second groove is disposed between the second region and the third region, the second groove being longer than a second side of the second semiconductor chip and a first side of the third semiconductor chip, each of which faces the second groove, and the second groove having a first part and a second part along an extending direction of the second groove; and a first wire extending from the first pad of the second semiconductor chip to outside of the first metallic base portion, the first wire being shorter than the first groove and the second groove, wherein the bonding material extends to at least the second groove, the bonding material reaches the first part of the second groove, and no bonding material reaches the second part of the second groove.

2. The semiconductor device according to claim 1, wherein at least one of the first semiconductor chip, the second semiconductor chip and the third semiconductor chip includes a transistor chip.

3. The semiconductor device according to claim 1, further comprising a second wire extending from the second pad of the second semiconductor chip to outside of the first metallic base portion, the second wire being longer than the first wire.

4. The semiconductor device according to claim 3, the first wire and the second wire extend in an extending direction of the first groove and the second groove.

5. The semiconductor device according to claim 3, further comprising a resin package sealing the first metallic base portion, the first semiconductor chip, the second semiconductor chip and the third semiconductor chip, wherein the first metallic base portion includes a terminal extending from inside of the resin package to outside of the resin package, a part of the second wire disposed outside of the first metallic base portion extends in a direction intersecting with an extending direction of the terminal.

6. The semiconductor device according to claim 1, wherein at least one of the fourth semiconductor chip, the fifth semiconductor chip and the sixth semiconductor chip includes a diode chip.

7. The semiconductor device according to claim 1, further comprising a resin package sealing the first metallic base portion, the first semiconductor chip, the second semiconductor chip and the third semiconductor chip, wherein the first metallic base portion includes a terminal extending from inside of the resin package to outside of the resin package.

8. The semiconductor device according to claim 7, wherein a through-hole is formed in a part of the terminal of the first metallic base portion.

9. The semiconductor device according to claim 8, wherein the part of the terminal is disposed outside of the resin package.

10. The semiconductor device according to claim 1, wherein the first groove has a first part and a second part along an extending direction of the first groove, the bonding material reaches the first part of the first groove, and no bonding material reaches the second part of the first groove.

11. The semiconductor device according to claim 1, further comprising a resin package sealing the first metallic base portion, the first semiconductor chip, the second semiconductor chip and the third semiconductor chip, wherein the first metallic base portion includes a terminal extending from inside of the resin package to outside of the resin package, a part of the first wire disposed outside of the first metallic base portion extends in a direction intersecting with an extending direction of the terminal.

12. The semiconductor device according to claim 1, further comprising:

a second metallic base portion spaced from the first metallic base portion; and a seventh semiconductor chip disposed on the second metallic base portion, the seventh semiconductor chip having a substantially rectangular shape in a plan view.

13. A semiconductor device comprising:

a metallic plate having a first area, a second area and a third area;

a first semiconductor chip disposed on the first area of the metallic plate;

a second semiconductor chip disposed on the second area of the metallic plate;

a third semiconductor chip disposed on the third area of the metallic plate;

a fourth semiconductor chip disposed on the first area of the metallic plate;

a fifth semiconductor chip disposed on the second area of the metallic plate;

a sixth semiconductor chip disposed on the third area of the metallic plate;

a bonding material connecting each of the first semiconductor chip, the second semiconductor chip, the third semiconductor chip, the fourth semiconductor chip, the fifth semiconductor chip and the sixth semiconductor chip with the metallic plate;

a first groove formed on the metallic plate such that the first groove defines a part of the first area on which both the first semiconductor chip and the fourth semiconductor chip are disposed, a bottom portion of the first groove being formed by a part of the metallic plate;

a second groove formed on the metallic plate such that the second groove defines a part of the second area on which both the second semiconductor chip and the fifth semiconductor chip are disposed;

a wire extending from a pad of the second semiconductor chip to outside of the metallic plate, the wire being shorter than the first groove and the second groove.

14. The semiconductor device according to claim 13, wherein the second area of the metallic plate is sandwiched between the first groove and the second groove.

15. The semiconductor device according to claim 13, wherein a depth of the first groove is less than $\frac{1}{10}$ of a thickness of the metallic plate.

16. A semiconductor device comprising:

a first metallic base portion;

a first semiconductor chip, a second semiconductor chip and a third semiconductor chip disposed on the first metallic base portion such that the first semiconductor chip, the second semiconductor chip and the third semiconductor chip are spaced from each other in a first direction, each of the first semiconductor chip, the second semiconductor chip and the third semiconductor chip having a substantially rectangular shape in a plan view, and the second semiconductor chip having a first pad and a second pad;

a fourth semiconductor chip disposed on a first region of the first metallic base portion in which the first semiconductor chip is disposed;
a fifth semiconductor chip disposed on a second region of the first metallic base portion in which the second semiconductor chip is disposed;
a sixth semiconductor chip disposed on a third region of the first metallic base portion in which the third semiconductor chip is disposed;
a bonding material connecting each of the first semiconductor chip, the second semiconductor chip, the third semiconductor chip, the fourth semiconductor chip, the fifth semiconductor chip and the sixth semiconductor chip with the first metallic base portion;
a first groove formed on the first metallic base portion such that the first groove is disposed between the first region and the second region, the first groove being longer than a first side of the first semiconductor chip and a first side of the second semiconductor chip, each of which faces the first groove, a bottom portion of the first groove being formed by a part of the first metallic base portion;
a second groove formed on the first metallic base portion such that the second groove is disposed between the second region and the third region, the second groove being longer than a second side of the second semiconductor chip and a first side of the third semiconductor chip, each of which faces the second groove; and
a first wire extending from the first pad of the second semiconductor chip to outside of the first metallic base portion, the first wire being shorter than the first groove and the second groove.

17. The semiconductor device according to claim 16, wherein a depth of the first groove is less than 1/10 of a thickness of the first metallic base portion.

18. A semiconductor device comprising:
a first metallic base portion;
a first semiconductor chip, a second semiconductor chip and a third semiconductor chip disposed on the first metallic base portion such that the first semiconductor chip, the second semiconductor chip and the third semiconductor chip are spaced from each other in a first direction, each of the first semiconductor chip, the second semiconductor chip and the third semiconductor chip having a substantially rectangular shape in a plan view, and the second semiconductor chip having a first pad and a second pad;
a bonding material connecting each of the first semiconductor chip, the second semiconductor chip and the third semiconductor chip with the first metallic base portion;
a first groove formed on the first metallic base portion such that the first groove is disposed between a first side of the first semiconductor chip and a first side of the second semiconductor chip opposite the first side of the first semiconductor chip, the first groove being longer than the first side of the first semiconductor chip and the first side of the second semiconductor chip;
a second groove formed on the first metallic base portion such that the second groove is disposed between a second side of the second semiconductor chip and a first side of the third semiconductor chip opposite the second side of the second semiconductor chip, the second groove being longer than the second side of the second semiconductor chip and the first side of the third semiconductor chip; and
a first wire extending from the first pad of the second semiconductor chip to outside of the first metallic base portion, the first wire being shorter than the first groove and the second groove, wherein
the bonding material extends to at least one of the first groove and the second groove,
the second groove has a first part and a second part along an extending direction of the second groove,
the bonding material reaches the first part of the second groove, and
no bonding material reaches the second part of the second groove.

* * * * *